(12) United States Patent
Tan et al.

(10) Patent No.: US 12,300,336 B2
(45) Date of Patent: May 13, 2025

(54) MEDIA SCAN IN MEMORY SYSTEMS

(71) Applicant: Yangtze Memory Technologies Co., Ltd., Hubei (CN)

(72) Inventors: Hua Tan, Wuhan (CN); Xing Wang, Wuhan (CN); Yaolong Gao, Wuhan (CN); Fanya Bi, Wuhan (CN); Zhe Sun, Wuhan (CN); Bo Yu, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 53 days.

(21) Appl. No.: 18/327,642

(22) Filed: Jun. 1, 2023

(65) Prior Publication Data

US 2024/0371458 A1   Nov. 7, 2024

Related U.S. Application Data

(63) Continuation of application No. PCT/CN2023/092209, filed on May 5, 2023.

(51) Int. Cl.
*G11C 29/10* (2006.01)
*G06F 3/06* (2006.01)
(Continued)

(52) U.S. Cl.
CPC ............ *G11C 29/10* (2013.01); *G06F 3/0604* (2013.01); *G06F 3/0619* (2013.01); *G06F 3/064* (2013.01);
(Continued)

(58) Field of Classification Search
CPC . G11C 29/10; G11C 16/3427; G11C 16/3422; G11C 29/028; G11C 29/42;
(Continued)

(56) References Cited

U.S. PATENT DOCUMENTS 10,691,377 B2 *   6/2020  Alsasua ................. G06F 3/064
10,892,024 B2 *   1/2021  Vashi ..................... G11C 16/349
(Continued)

FOREIGN PATENT DOCUMENTS

CN   109582493   4/2019
CN   111801739   10/2020
(Continued)

OTHER PUBLICATIONS

International Search Report and Written Opinion in International Appln. No. PCT/CN2023/092209, mailed on Jun. 16, 2023, 6 pages.

*Primary Examiner* — John J Tabone, Jr.
(74) *Attorney, Agent, or Firm* — Fish & Richardson P.C.

(57) ABSTRACT

The present disclosure involves methods, apparatuses, and computer-readable storage media for media scan in a memory system. In one example, a method for a memory system includes receiving commands from a host coupled to the memory system, wherein the memory system includes a memory device, the memory device includes a memory cell array, and the memory cell array includes a number of memory cells. The method further includes performing operations on the memory device based on the commands. The method further includes scanning at least a group of memory cells of the memory cell array by performing a number of scans within a scan period among the operations.

20 Claims, 8 Drawing Sheets

(51) Int. Cl.
  *G11C 16/34*  (2006.01)
  *G11C 29/02*  (2006.01)
  *G11C 29/42*  (2006.01)

(52) U.S. Cl.
  CPC .......... *G06F 3/0659* (2013.01); *G06F 3/0679* (2013.01); *G11C 16/3422* (2013.01); *G11C 16/3427* (2013.01); *G11C 29/028* (2013.01); *G11C 29/42* (2013.01)

(58) Field of Classification Search
  CPC ...... G06F 3/064; G06F 3/0604; G06F 3/0679; G06F 3/0659; G06F 3/0619
  USPC ................ 714/719, 721, 704; 365/200, 201, 365/185.09; 369/30.21, 30.22
  See application file for complete search history.

(56) References Cited

U.S. PATENT DOCUMENTS

| | | | | |
|---|---|---|---|---|
| 11,269,553 B2* | 3/2022 | Alsasua | ................ | G06F 3/0679 |
| 11,417,405 B2* | 8/2022 | Vashi | .................... | G11C 16/26 |
| 11,709,633 B2* | 7/2023 | Alsasua | ................ | G06F 3/0659 |
| | | | | 711/103 |
| 2008/0316850 A1* | 12/2008 | Penzes | .................... | G11C 5/14 |
| | | | | 365/228 |
| 2016/0179597 A1* | 6/2016 | Gorobets | ............ | G11C 11/5628 |
| | | | | 714/704 |
| 2019/0362798 A1* | 11/2019 | Yang | .................... | G06F 11/1048 |
| 2020/0097211 A1* | 3/2020 | Alsasua | ................ | G06F 3/0659 |
| 2020/0211664 A1* | 7/2020 | Vashi | .................. | G06F 11/3034 |
| 2020/0278814 A1* | 9/2020 | Alsasua | ................ | G06F 3/0679 |
| 2021/0125675 A1* | 4/2021 | Vashi | .................... | G11C 16/16 |
| 2022/0188040 A1* | 6/2022 | Alsasua | ................ | G06F 3/0659 |
| 2024/0006012 A1* | 1/2024 | Hoff | ................ | G11C 29/1201 |
| 2024/0069748 A1* | 2/2024 | Xie | ........................ | G11C 29/52 |

FOREIGN PATENT DOCUMENTS

| | | |
|---|---|---|
| CN | 112912959 | 6/2021 |
| CN | 114253465 | 3/2022 |

* cited by examiner

MEDIA SCAN IN MEMORY SYSTEMS

CROSS-REFERENCE TO RELATED APPLICATIONS

This application is a continuation of International Application No. PCT/CN2023/092209, filed on May 5, 2023, the disclosure of which is hereby incorporated by reference in its entirety.

TECHNICAL FIELD

The present disclosure generally relates to memory devices and memory systems, and in particular, to media scan in memory systems.

BACKGROUND

Storage class memory (SCM), as a persistent memory, is a non-volatile memory and storage technology that may provide faster access speed and lower latency compared to a NAND flash memory and larger storage capacity and higher durability than a dynamic random access memory (DRAM) at reduced costs. An example of the SCM technology is a phase change memory (PCM). A PCM device uses a phase change material to store information. The phase change material has different levels of resistance when it is in different physical states. For example, when the phase change material is in an amorphous state, it has a high resistance. The resistance becomes lower when the phase change material changes to a crystalline state. Thus, a PCM device may include memory cells made of a phase change material. Changing a state of a memory cell's phase change material stores information to the memory cell. The stored information may then be read from the memory cell by detecting the state of the phase change material.

SUMMARY

The present disclosure involves methods, apparatuses, and computer-readable storage media for media scan in a memory system. In one example, a method for a memory system includes receiving commands from a host coupled to the memory system, wherein the memory system includes a memory device, the memory device includes a memory cell array, and the memory cell array includes a number of memory cells. The method further includes performing operations on the memory device based on the commands. The method further includes scanning at least a group of memory cells of the memory cell array by performing a number of scans within a scan period among the operations.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

A phase change memory (PCM) device uses a phase change material to store information. Applying a voltage across the phase change material may change its state and electrical conductivity. The phase change material may switch between an amorphous state and a crystalline state. In some implementations, the amorphous state is referred to as a reset state and may correspond to a bit value of 0, and the crystalline state is referred to as a set state and may correspond to a bit value of 1. The switch between the amorphous state and the crystalline state may be triggered by melting and cooling caused by an electrical pulse. A threshold voltage (Vt) represents a threshold at which the phase change material undergoes a shift in electrical conductivity. The phase change material in the amorphous state usually has a high resistance. When a voltage above a Vt for the amorphous state (reset Vt) is applied across the amorphous phase change material for a time period, the phase change material may become electrically conductive and melted by heat generated by a current flow. After quick cooling, the phase change material is in the crystalline state and has a low resistance. Similarly, applying a voltage above a Vt for the crystalline state (set Vt) across the crystalline phase change material for another time period may change the phase change material to the amorphous state.

Applying a voltage above a Vt across a PCM cell may generate a transient current, which may be utilized to read a bit value that the PCM cell stores. For example, if the voltage applied to the PCM cell is between a set Vt and a reset Vt, then the presence of the transient current may indicate that the PCM cell is in the set state. In other words, the bit value of the PCM cell is 1. On the other hand, the absence of the transient current may indicate that the PCM cell is in the reset state and stores the bit value of 0.

Figure 1:
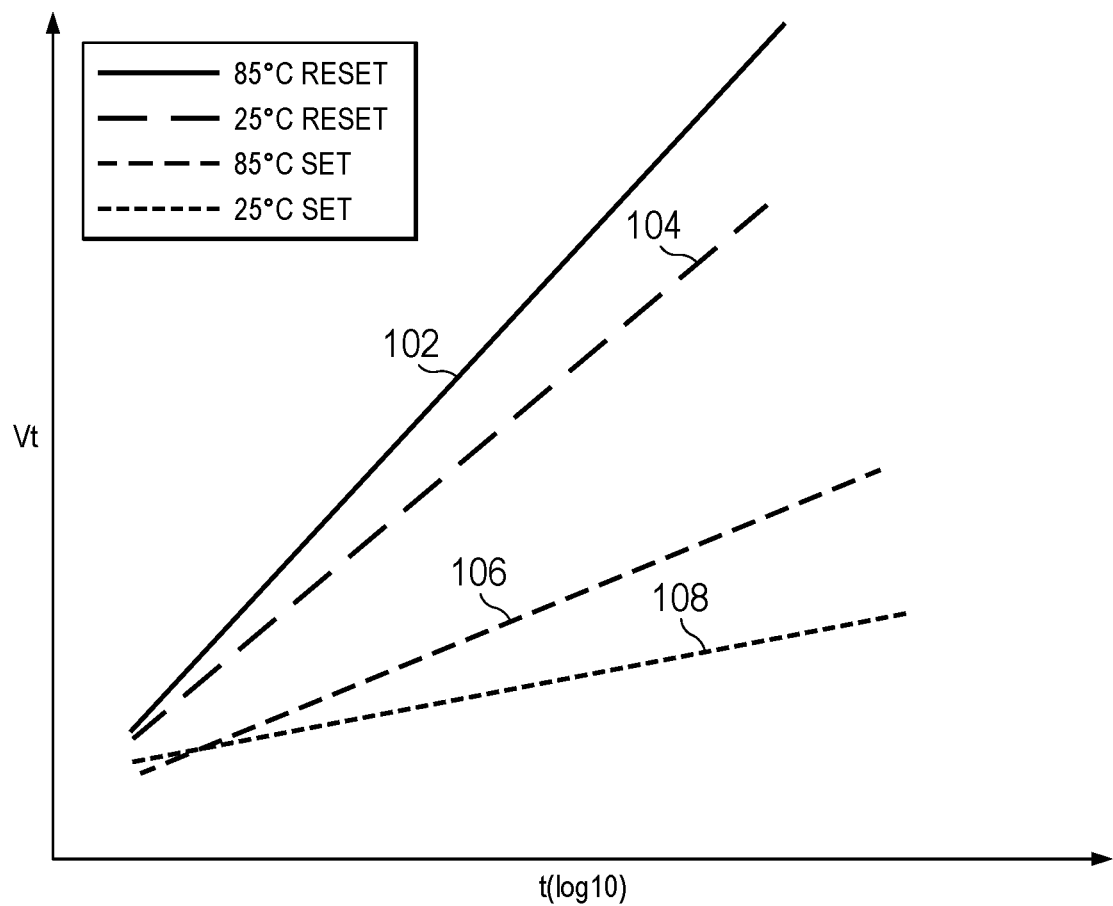
FIG. 1 illustrates some examples of threshold voltage (Vt) drifts.

The Vt of the phase change material tends to shift or drift over time. This phenomenon can be referred to as Vt drift. The reset Vt and the set Vt may have different drift speeds. As shown in FIG. 1, in some cases the reset Vt (102 or 104) drifts faster than the set Vt (106 or 108). Both the set Vt and the reset Vt may drift faster at a higher temperature. For example, the reset Vt drifts faster at 85° C. (102) than it does at 25° C. (104), and the set Vt also drifts faster at 85° C. (106) than it does at 25° C. (108).

Performance of a PCM memory device may be affected by Vt drift. The Vt drift may cause memory cell read errors and data corruption, because a default read voltage between the original set Vt and reset Vt may not be appropriate to distinguish the shifted set Vt and reset Vt. Sometimes the read errors may be recoverable by triggering the read error recovery flow. But the memory read speed may be reduced or slowed due to delay caused by the recovery process. Sometimes uncorrectable read errors may result in read margin loss. Furthermore, long-time Vt drift may damage a memory cell permanently, such that the memory cell cannot be set and reset again.

The present disclosure provides techniques for a memory system to use media scan to detect Vt drift and prevent data corruption. In some implementations, periodical media scan of an entire memory device of the memory system may be performed. In some implementations, periodical media scan of a portion of the memory device of the memory system may be performed. The portion of the memory device to be scanned can be programmed or otherwise specified. For example, the memory system may include a memory device that has multiple memory cells. The memory system may receive commands from a host and perform operations on the memory device based on the commands. The periodical media scan of the entire memory device includes scanning a group of memory cells of the memory device within a period among the operations. In some implementations, the periodical media scan of the entire memory system includes scanning another group of memory cells of the memory device within another period. Different groups of memory cells may have different scan periods or intervals, which may be determined based on, for example, an electric distance of each group of memory cells or one or more other factors. The above aspects and some other aspects of the present disclosure are discussed in greater detail below.

Figure 2:
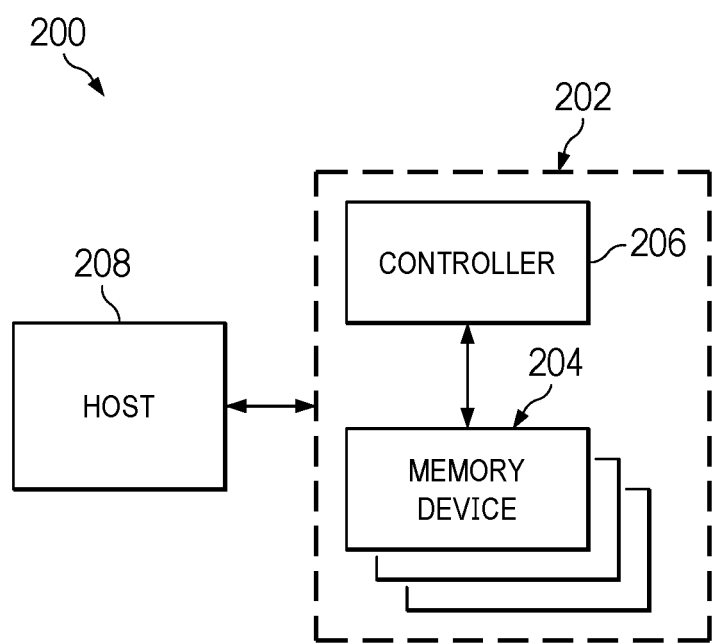
FIG. 2 illustrates a block diagram of an example system coupled to a host, according to some aspects of the present disclosure.

FIG. 2 illustrates an example of a block diagram of system 200 having a memory device, according to some aspects of the present disclosure. System 200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 2, system 200 can include a host 208 and a memory system 202 having one or more memory devices 204 and a memory controller 206. Host 208 can be a processor of an electronic device, such as a central processing unit (CPU), or a system-on-chip (SoC), such as an application processor (AP). Host 208 can be configured to send or receive data to or from memory devices 204.

Memory controller 206 is coupled to memory device 204 and host 208 and is configured to control memory device 204, according to some implementations. Memory controller 206 can manage the data stored in memory device 204 and communicate with host 208. In some implementations, memory controller 206 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 206 is designed for operating in a high duty-cycle environment solid state drives (SSDs) or embedded multi-media-cards (eMMCs) used as data storage for mobile devices, such as smartphones, tablets, laptop computers, etc., and enterprise storage arrays. Memory controller 206 can be configured to control operations of memory device 204, such as read, erase, and program operations. Memory controller 206 can also be configured to manage various functions with respect to the data stored or to be stored in memory device 204 including, but not limited to bad-block management, garbage collection, logical-to-physical address conversion, wear leveling, etc. In some implementations, memory controller 206 is further configured to process error correction codes (ECCs) with respect to the data read from or written to memory device 204. Any other suitable functions may be performed by memory controller 206 as well, for example, formatting memory device 204.

Memory controller 206 can communicate with an external device (e.g., host 208) according to a particular communication protocol. For example, memory controller 206 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

In some implementations, the memory system 202 does not include the memory controller 206, and the host 208 is coupled to the memory device 204 directly. The memory controller 206 may be located in the host 208. Alternatively, the host 208 may not include the memory controller 206 either but may be configured to perform functions similar to what the memory controller 206 does as described above.

Figure 3:
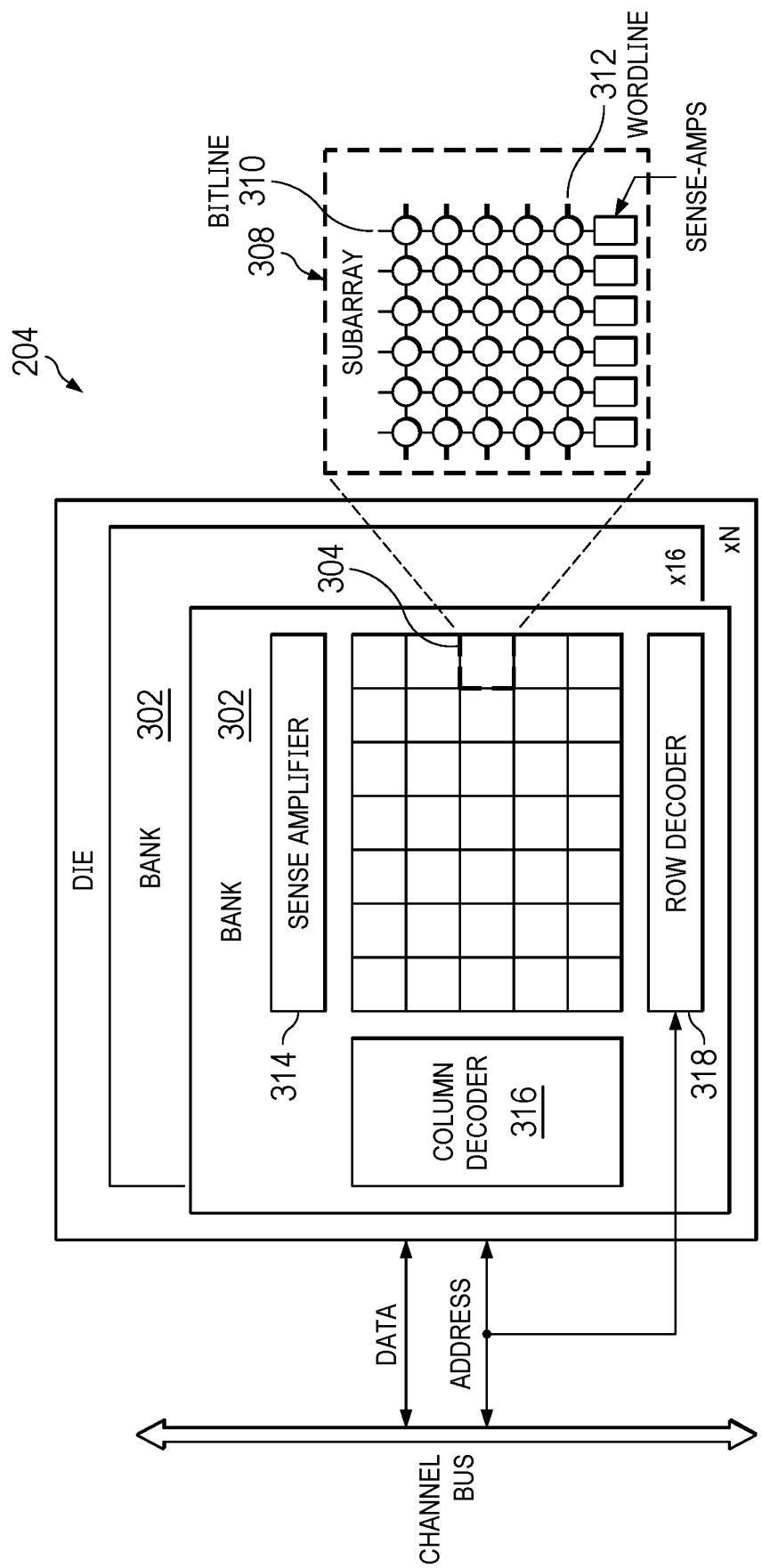
FIG. 3 illustrates a block diagram of an example phase change memory (PCM) cell array coupled to peripheral circuits, according to some aspects of the present disclosure.

Memory device 204 can be any memory device disclosed in the present disclosure. FIG. 3 illustrates a block diagram of an example memory device 204, according to some aspects of the present disclosure. The memory device 204 includes a set of memory banks 302. Each memory bank 302 includes a memory array 304 (also referred to as a memory cell array) having memory cells arranged in rows and columns. The memory array 304 may be divided into a number of memory sub-arrays 308 for efficient wiring and low power consumption. In some implementations, each or at least one of the memory cells includes a PCM element. The PCM element may be programmed to either a set state or a reset state to store data as described above. Each memory cell is connected to a bit line 310 and a word line 312. Each memory bank 302 includes a data buffer/sense amplifier 314, a column decoder/bit line driver 316, and a row decoder/word line driver 318. In some examples, additional peripheral circuits not shown in FIG. 3 may be included as well.

Data buffer/sense amplifier 314 can be configured to read and program (write) data from and to memory cell array 304 according to control signals from a memory controller (e.g., the memory controller 206 of FIG. 2). In one example, data buffer/sense amplifier 314 may store one codeword of program data (write data) to be programmed into memory cell array 304. In another example, data buffer/sense amplifier 314 may perform program verify operations to ensure that the data has been properly programmed into select memory cells coupled to selected word lines 312. In yet another example, data buffer/sense amplifier 314 may also sense the low power signals from bit line 310 that represents a data bit stored in a memory cell and amplify the small voltage swing to recognizable logic levels in a read operation.

Column decoder/bit line driver 316 may be connected to the memory cell array 304 via bit lines and select/drive one or more bit lines to perform an operation on memory cell coupled to a selected bit line. Row decoder/word line driver 318 may be connected to the memory cell array 304 via word lines and select/drive one or more word lines to perform an operation on memory cell coupled to a selected word line.

Figure 4:
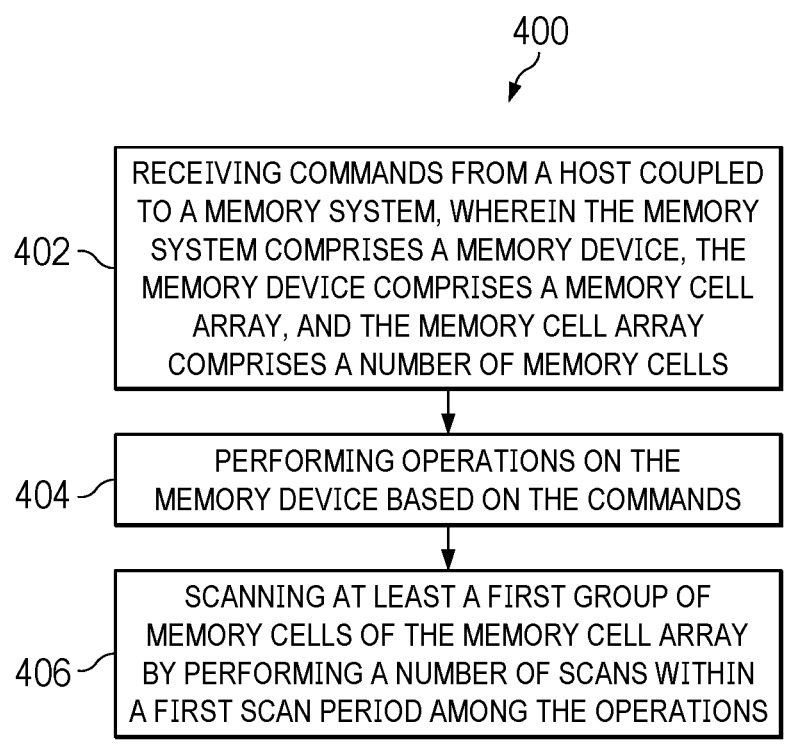
FIG. 4 illustrates an example of a method for media scan in a memory system, according to some aspects of the present disclosure.

FIG. 4 is a flowchart of an example method 400 for a memory system to perform media scan, in accordance with some aspects of the present disclosure. The method 400 may be performed by any suitable device disclosed herein, such as the memory system 202, the memory device 204, the memory controller 206 in FIG. 2, and any combination thereof. The operations shown in method 400 may not be exhaustive and that other operations can be performed as well before, after, or between any of the illustrated operations. Further, some of the operations may be performed simultaneously, or in a different order than shown in FIG. 4.

At 402, the memory system receives commands from a host coupled (e.g., host 208) to the memory system (e.g., memory system 202). The memory system includes a memory device (e.g., memory device 204). The memory device includes a memory cell array (e.g., memory cell array 304). The memory cell array includes a number of memory cells. The memory system may include a memory controller (e.g., memory controller 206) coupled to the host.

In some implementations, the commands are received by the memory controller from the host. The commands may be typical memory operation commands from the host. For example, the commands include at least one of a memory read command, a memory write command or a memory erase command.

In some implementations, the number of memory cells are a number of PCM memory cells. As described, the PCM memory cells may be subject to Vt drift.

In some implementations, the memory device of the memory system is a storage class memory (SCM) device.

At 404, the memory system performs operations on the memory device based on the commands. For example, if the commands include one or more memory read commands and one or more memory write commands, the operations can include one or more memory read operation and one or more memory write operations, accordingly. In some implementations, at 404, the memory controller of the memory system transmits the commands received from the host to the memory device so that the memory device can perform corresponding memory operations according to the commands.

At 406, the memory system scans at least a first group of memory cells of the memory cell array by performing a number of scans within a first scan period among the operations. The present disclosure provides techniques for a memory system to use periodical media scan to detect Vt drift and prevent data corruption. In some implementations, at 406, the memory system scans some or all memory cells of an entirety of the memory device within the first scan period. The memory system may repeat 406 periodically, from time to time, or on demand. For example, the memory system may perform media scan of the whole memory system as a repeated sequence of behaviors. The media scan of the entire memory device may be performed within the first scan period. In some implementations, the frequency of the periodical media scan is determined by the first scan period or one or more other factors.

Whether Vt drift occurs in a PCM cell depends on multiple factors, such as the time that has passed since the last write operation on the PCM cell, specific status of the PCM cell, the temperature of the PCM cell, etc. It may be difficult to determine these factors in a memory device. For example, the temperature of the PCM cell may keep changing with the surrounding environment. Recording page time after program in a table of the memory device may be difficult because the table is of a large size. Sometimes it may not be feasible to record time when the memory device is powered off. In another example, the memory device may store some cold data, which have not been read by the host for a long time. For at least the above reasons, it is usually not easy to determine which memory cell in the memory device has Vt drift without a scan of the whole memory device (referred to as a full media scan). Thus, periodical full media scan may allow the memory system to detect Vt drift and even a degree of the Vt drift in a PCM cell, which may prevent unnoticed data corruption in the memory system.

In some implementations, the first scan period is a period for scanning all memory cells of the memory system, which may also be referred to as a media scan period or a media scan time interval (MS_TIME_INTERVAL). The MS_TIME_INTERVAL may be a predetermined parameter and may be dynamically adjustable. An example of the MS_TIME_INTERVAL is 24 hours, which means that each memory cell of the entire memory system will be scanned every 24 hours. This way, Vt drift of a memory cell may be detected and fixed in time before it gets worse. A shorter MS_TIME_INTERVAL means more frequent media scan, which may cause a larger overhead of the memory device. The longer MS_TIME_INTERVAL is, the larger the chance of some memory cells having Vt drift. Thus, to strike a balance between the performance of the memory system, a suitable MS_TIME_INTERVAL is desired. In some implementations, a MS_TIME_INTERVAL may be determined based on one or more of the size of the memory device, reliability requirement, the Quality of Service (QOS) requirement, or other factors of the memory system.

In some implementations, scanning a memory cell during the media scan is controlled by the memory controller. To scan a memory cell, the memory controller may generate a scan command for the memory cell and transmit the scan command to the memory device. In some implementations, the scan command can be in the form of a read command. For the memory controller's perspective, the scan command is generated by the memory controller, rather than being received from the host. From the memory device's perspective, the scan command may be a memory read command, similar to a memory read command sent or requested by the host (also referred to as a regular memory read command or a host memory read command). In some implementations, the memory device may not distinguish the memory scan command from the regular memory read command. In some implementations, the memory device may distinguish the memory scan command from the regular memory read command because these two commands may use different command codes. In some implementations, multiple adjacent regular memory read commands may use random addresses, and multiple adjacent memory scan commands may use consecutive addresses. In some implementations, each memory read command may return a result indicating how many bits are not correctly read. The number of bits that are not correctly read can be referred to a fail bit count (FBC). The FBC can be based on a portion or unit of memory cells that have been scanned. For example, scanning a codeword generates an FBC of the codeword. The scanning result may suggest a degree of Vt drift occurred on the memory cell. For example, a small number of bit errors may indicate that the memory cell has no Vt drift or a small Vt drift. A large number of bit errors may indicate a significant Vt drift on the memory cell.

When the host is idle (for example, the host is not sending memory commands to the memory controller), the media scan may not impact the QoS of the memory device. The memory controller may scan as many as memory cell as possible if it can do so (for example, if the memory device is powered on and has a normal working power supply). When the host requests reading or writing the memory device, the memory system receives commands from the host (for example, 402 of FIG. 4). In this case, media scan will likely increase the latency in the memory device's response to the host's regular memory read and write commands. To reduce such latency and maintain the QoS of the memory device, the memory system may spread or disperse the scans among the operations generated in response to the host commands.

In some implementations, the memory controller forwards the host's commands (e.g., regular memory read and write commands) to the memory device. During the media scan, the memory controller may insert one or more scan commands among the regular memory read and write commands the memory controller transmits to the memory device. As an example implementation, the memory controller may evenly distribute the scan commands among the host's commands, such that the scan commands are dispersed into the host's commands in an uniformly manner. As another example implementation, the memory controller may distribute the scan commands among the host's commands in an unevenly or a non-uniform manner, for example, based on computational loads of the operations performed by the memory device to reduce such latency and maintain the QoS of the memory device.

In some implementations, the scan commands or the media scan is managed by a data management (DM) layer of firmware of the memory controller.

In some implementations, a scan command is volume-based (e.g., page-based). For example, each scan command may cause a read operation of a fixed number of memory cells of the memory device (e.g., a page of memory cells). If a certain memory cell is not in a good condition (for example, it has significant Vt drift), the memory read operation takes longer due to more than one read attempt triggered by initial reading error that triggers a read error recovery flow. In this case, the media scan based on a fixed number of memory cells may cause unexpected latency in the memory device's response to the host.

In some implementations, a scan command is time-based. For example, each time-based scan command may cause a read operation of the memory device for a fixed time period. Although each time-based scan is performed for the same amount of time, it may scan or read different numbers of memory cells during the same amount of time. If the fixed time period has elapsed, a media scan will pause even though a memory cell has not been read correctly. The memory device may go back to respond to the next command after the scan commend (e.g., a regular memory read or write operations from the host). When it is time to perform the next scheduled scan operation, the memory device may resume the media scan for another fixed time period starting from the previous unsuccessful memory cell.

Figure 5:
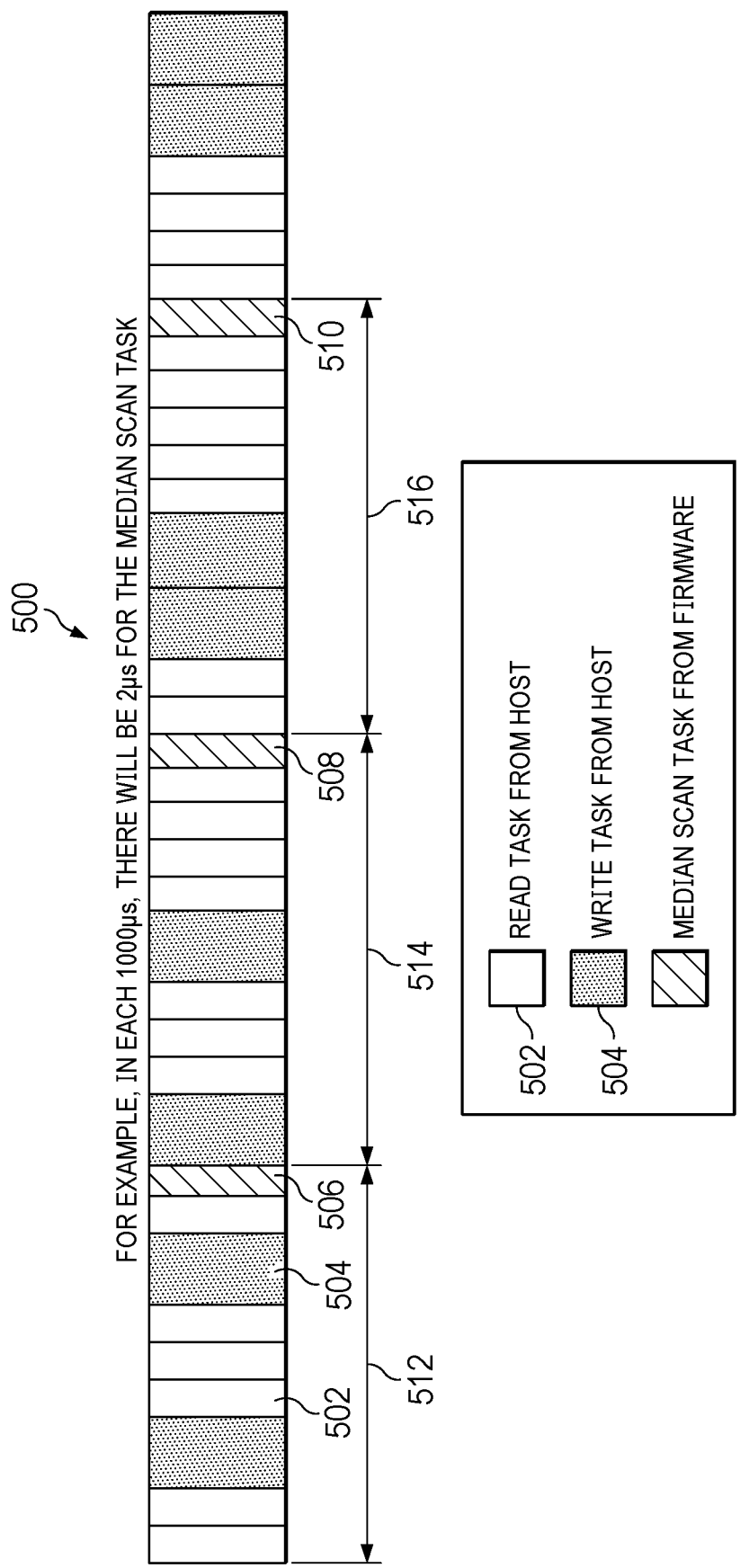
FIG. 5 illustrates an example of time-based scans, according to some aspects of the present disclosure.

FIG. 5 illustrates time-based media scans in accordance with some aspects of the present disclosure. Memory operations 500 show a number of memory operations that the memory controller transmit to the memory device when the memory controller performs both media scan and operations requested by the host. In some implementations, the memory controller may first determine media scan frequency based on the total number of memory cells in the memory device and the MS_TIME_INTERVAL. In this example, the memory controller determines a 2 μseconds (μs) scan for every 1000 μs to scan the whole memory device within the MS_TIME_INTERVAL. The memory controller may receive read commands 502 and write commands 504 from the host. The memory controller may then forward the read commands 502 and write commands 504 to the memory device. As shown in FIG. 5, each of time periods 512, 514, and 516 represents a period of 1000 μs. Every 1000 μs, the memory controller inserts a 2 μs scan to the host's commands and sends both the scan command and the host's commands to the memory device. In this example, the 2 μs scan is located at the end of each 1000 μs. In some other implementations, the 2 μs scan may be located in other positions (for example, at beginning or in the middle of the 1000 μs period). In this example, the interval between two adjacent 2 μs scans is always 998 μs. In some implementations, the interval between two adjacent 2 μs scans may vary as long as a 2 μs scan occurs every 1000 μs.

In some implementations, if the memory system knows that some memory cells may experience faster Vt drifts, the memory system may scan these memory cells more frequently by assigning a smaller MS_TIME_INTERVAL to these memory cells. In some implementations, the memory device may divide its memory cells into multiple areas or groups. The multiple areas or groups may have different likelihood or level of Vt. These groups of memory cells may use different MS_TIME_INTERVAL.

In some implementations, the MS_TIME_INTERVAL may be determined based on an electrical distance (ED) between a memory cell and its driver (for example, a bit line driver or a word line driver connected to the memory cell), or one or more other metrics. The ED may not be the physical distance between the memory cell and the driver. In some implementations, the ED can be determined based on a conductive transmission line between the memory cell and the driver, a resistance of conductive transmission line, and/or the electronic components between the memory cell and the driver. The memory cells having different EDs may receive different levels of voltage or current. These voltage or current differences may accumulate and cause various Vt drifts to the memory cells. For example, memory cells with shorter EDs may tend to have faster or more significant Vt drifts.

Figure 6:
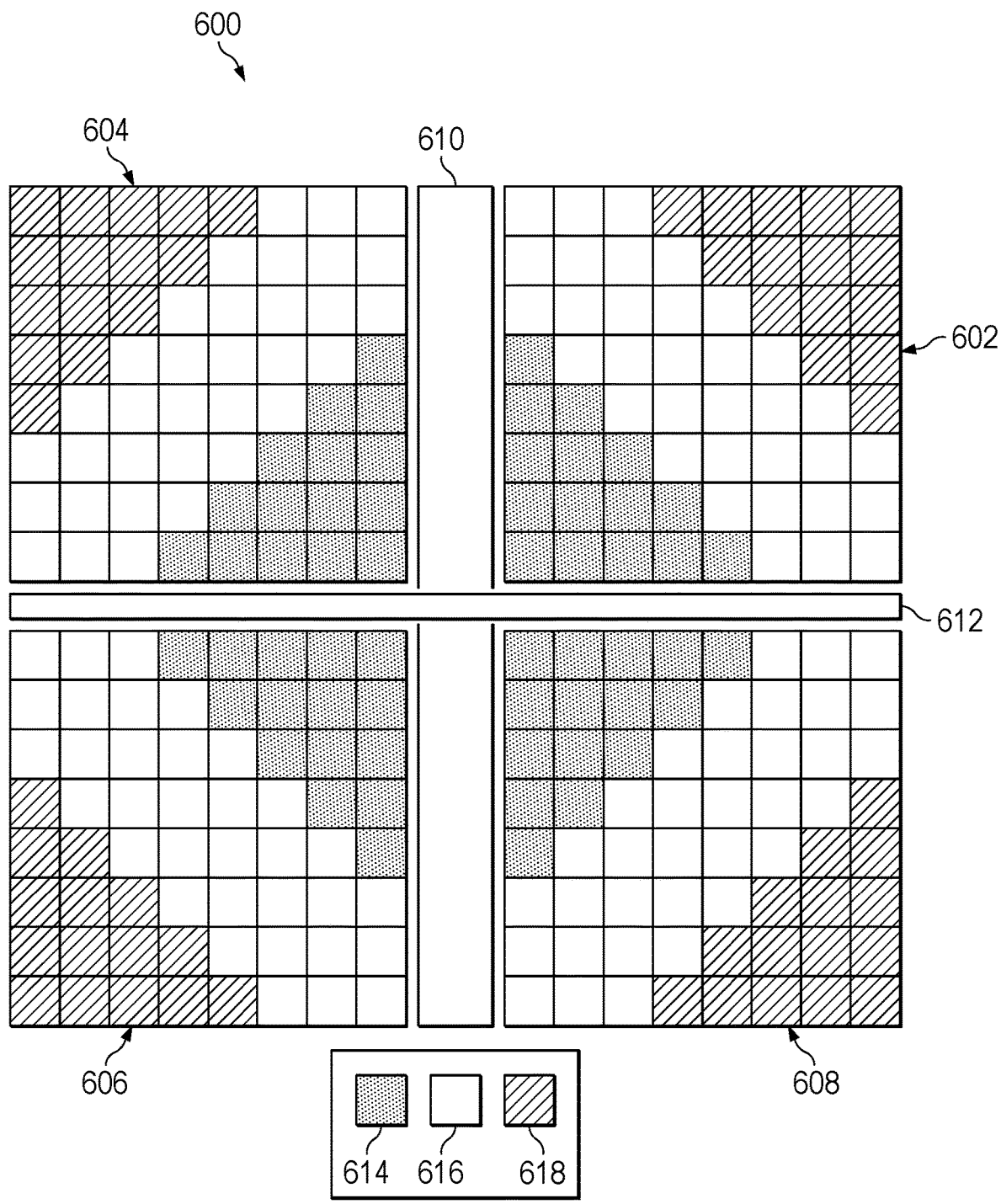
FIG. 6 illustrates an example of grouping memory cells based on electrical distances (Eds), according to some aspects of the present disclosure.

FIG. 6 shows an example of grouping memory cells based on EDs, in accordance with some aspects of the present disclosure. Memory array 600 in FIG. 6 has a word line drier 610 and a bit line driver 612. The word line drier 610 and the bit line driver 612 are located in the middle of the memory array 600 and divides the memory array 600 into four sub-arrays 602, 604, 606, and 608. In this example, putting drivers in the middle of the memory array may optimize the performance of the memory array by reducing distances between memory cells and the drivers. In some other cases, the drivers of the memory array may be placed in various locations (such as on the sides of the memory array). Referring to FIG. 6, the memory cells of the memory array 600 may be divided into three groups 614, 616, and 618. Each group may have a respective ED, which can be an average, weighted average, or other metric of one or more EDs of memory cells in each group. As an example, the ED of group 614 is shorter than the ED of the group 616, and the ED of the group 616 is shorter than the ED of group 618. Accordingly, groups 614, 616, and 618 may use different MS_TIME_INTERVAL. For example, the MS_TIME_INTERVAL for group 614 is smaller than the MS_TIME_INTERVAL for group 616, and the MS_TIME_INTERVAL for group 616 is smaller than the MS_TIME_INTERVAL for group 618. As an example, the MS_TIME_INTERVAL for group 614 can be set to 16 hours, the MS_TIME_INTERVAL for group 616 can be set to 24 hours, and the MS_TIME_INTERVAL for group 618 can be set to 32 hours. Other values can be assigned to the MS_TIME_INTERVALS of different groups. Accordingly, the memory cells in group 614 are scanned most frequently among the three groups while the memory cells in group 618 are scanned least frequently among the three groups. This can help balance the QoSs of the three groups and improve the QoS of the entire memory device because the memory cells in group 614 may undergo faster Vt drifts compared to the other two groups because larger voltages or currents are applied to them.

As an example implementation to classify a memory cell into a group, as shown in FIG. 6, a memory cell is classified into a group based on an ED between the memory cell and the bit line driver (ED_b), an ED between the memory cell and the word line driver (ED_w), and two threshold T1 and T2. If ED_b+ED_w is smaller than T1, the memory cell belongs to group 614. If ED_b+ED_w is larger than T1 and smaller than T2, the memory cell belongs to group 616. If ED_b+ED_w is larger than T2, the memory cell belongs to group 618. In some implementations, different grouping standards or criteria may be applied. For example, the grouping standard can be based on another function of ED_b and ED_w, including a maximum of ED_b and ED_w, a minimum of ED_b and ED_w, an average of ED_b and ED_w, a square root of ED_b×ED_b+ED_w×ED_w. Furthermore, different thresholds may be used for the grouping.

In some other implementations, the MS_TIME_INTERVAL may be determined based on one or more criteria or metrics other than ED, as long as the criteria or metrics affect Vt drift of a memory cell.

Figure 7:
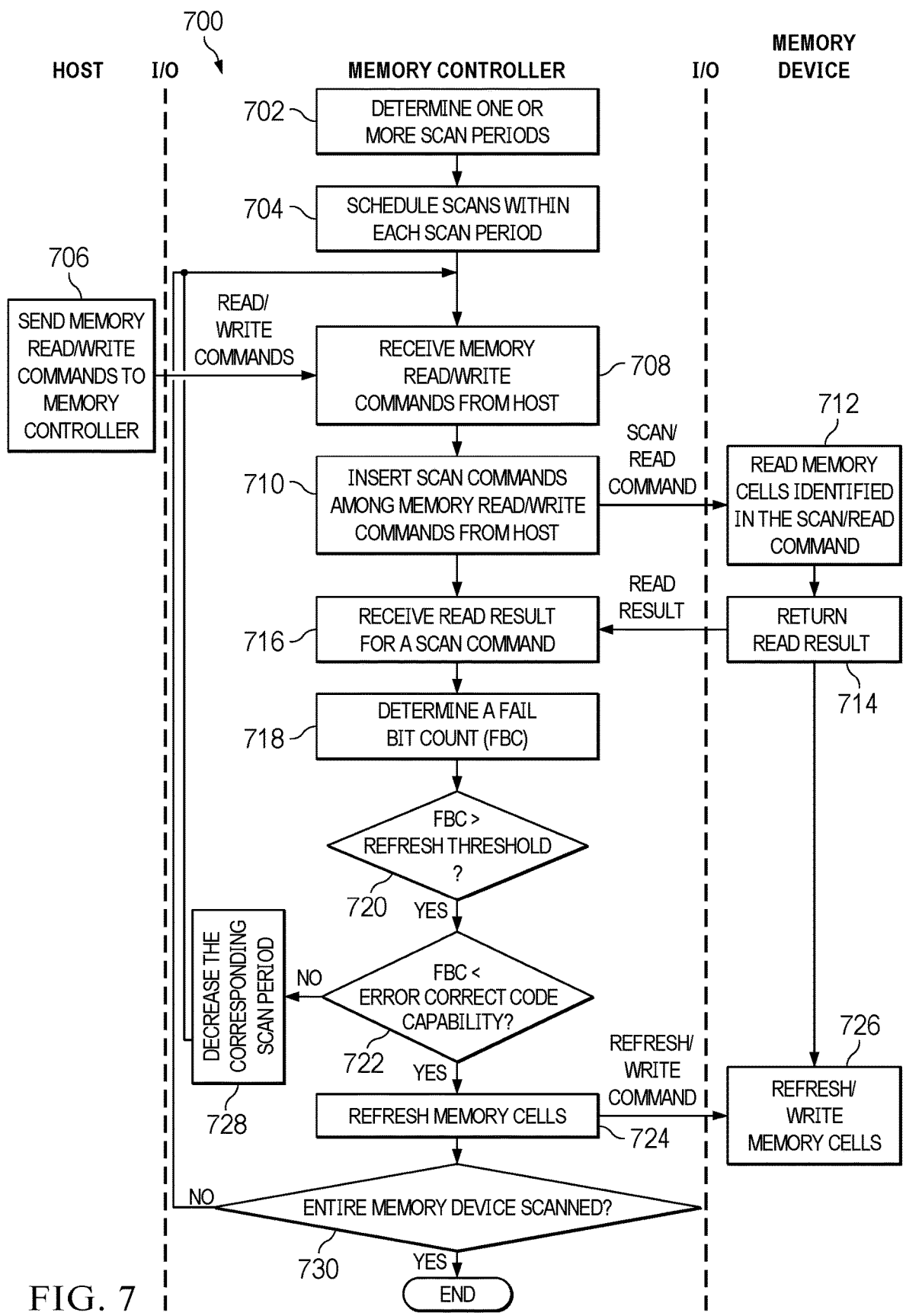
FIG. 7 illustrates a swimlane diagram of an example method for media scan, in accordance with some aspects of the present disclosure.

FIG. 7 is a swimlane diagram of an example method 700 for media scan, in accordance with some aspects of the present disclosure. The method 700 can be performed by a host (e.g., host 208 of FIG. 2) and a memory system (e.g., memory system 202 of FIG. 2). The method 700 will be described as being performed by a memory system having a memory controller and a memory device, programmed appropriately in accordance with this disclosure. The memory controller is coupled to the memory device and to the host. The memory device includes a memory cell array having a number of memory cells. In some implementations, some or all of the operations in the method 700 can be implemented based on the techniques described in connection with FIGS. 2-6. The operations shown in the method 700 may not be exhaustive and other operations can be performed as well before, after, or between any of the illustrated operations. Further, some of the operations may be performed simultaneously, or in a different order than shown in FIG. 7.

At 702, the memory controller determines one or more scan periods. The memory controller may only determine one scan period for all memory cells in the memory device. In some other cases (e.g., the example discussed in FIG. 6), the memory cells in the memory device is divided into multiple groups. The memory controller may determine multiple different scan periods and assign each scan period to a respective group of memory cells.

At 704, the memory controller schedules scans within each of the one or more scan periods. The memory controller may determine how many scans are required to cover one or more groups of memory cells in the memory device. For each of the one or more groups of memory cells, a number of scans may be determined based on at least the scan period for the group and a number of memory cells in the group.

At 706, the host sends commands to the memory controller within each of the one or more scan periods. The commands may be regular memory operation commands and may include at least one of a memory read command and a memory write command.

At 708, the memory controller receives the commands from the host.

At 710, the memory controller inserts scan commands among the commands the memory controller received from the host. The scan commands may be time-based memory read commands as described in FIG. 5. The time-based memory read commands may be uniformly inserted to the regular memory read, memory write commands or other commands received from the host. Then the memory controller transmits the scan commands and the commands from the host to the memory device.

At 712, the memory device receives the scan commands and the commands from the host. The memory device performs corresponding scan operations and regular memory operations based on the commands from the host. For example, the memory device performs time-based memory read operations that are uniformly inserted to the regular memory read and memory write commands received from the host. In some implementations, each adjacent two of the number of scans are performed with a uniform interval within a first scan period among the operations according to the commands from the host. In addition, the memory device determines memory cells identified in each of the scan commands and scan these memory cells by reading data from these memory cells.

At 714, the memory device returns a scan result or a read result to the memory controller.

At 716, the memory controller receives the scan result or the read result from the memory device.

At 718, the memory controller determines a fail bit count (FBC) in the read result. The FBC indicates how many bits are not read correctly when the memory device read a portion of the number of memory cells identified in the scan commands at 710 and 712. The portion of the number of memory cells may be configured in a flexible way. For example, the portion of the number of memory cells may refer to memory cells connected by a word line. Sometimes the portion of the number of memory cells may be a codeword. In another example, the portion of the number of memory cells refers to a memory block. In another example, the portion of the number of memory cells refers to a physical memory page. In yet another example, the portion of the number of memory cells refers to a sub-array (for example, sub-array 308 of FIG. 3).

At 720, the memory controller compares the FBC with a refresh threshold. The refresh threshold may be referred to as MS_RF_FBC_TH. A large FBC may indicate that the corresponding memory cells are not in a good condition due to Vt drift and thus may need to be refreshed. If the FBC is larger than the refresh threshold, the memory determines that the corresponding memory may have significant Vt drifts (724) and thus sends a refresh command to the memory device. In an example, the refresh threshold is 40 bits in a codeword.

At 726, the memory device receives the refresh command, for example, from the memory controller. The refresh command is a command that requests the memory device to read data from a memory cell and writes the same data back to the memory cell. The memory device refreshes the memory cell identified by the refresh command upon receiving the refresh command. By performing a memory write operation, the memory cell re-programs its set Vt and reset Vt to their original values.

In some implementations, the refresh command is triggered in response to determining that the FBC is larger than the refresh threshold. The refresh command can be performed to write correct data into the memory cell. For example, in response to determining that the scan result or the read result indicating erroneous or corrupted data, the memory controller can correct the scan result or the read result from the memory device to obtain the correct data, for example, based on ECC or other error recovery methods. The memory controller sends a write command including the correct data and corresponding address to the memory device. The memory device receives the write command and performs a write operation based on the write controller to refresh the memory cell.

In some cases, the FBC may be so large that it exceeds an error correction code (ECC) correction capability. For example, the FBC is 80 but the ECC correction capability is only 60 per codeword. In this case, due to the Vt drift, the data stored in a memory cell is too corrupted to be recovered. Thus, uncorrectable error correction code (UECC) may occur. In such a scenario, in some implementations, not only does the memory controller send a refresh command to the memory device, it may also determine that the memory cell should be scanned more often to avoid possible unrecoverable read errors in the future. The memory controller may decrease or shorten the scan period for the group in which the memory cell generates the large FBC. The new scan period may be applied after the current scan period elapses.

At 730, the memory controller check whether all memory cells in the entire memory device have been scanned. If so, the memory controller ends the current scan period and waits to perform operations in the next scan period. If there are still memory cells in the memory device that have not been scanned, the method goes back to 708, and memory controller keeps scanning the remaining memory cells as schedule in 704.

In some implementations, the memory controller may dynamically change media scan schedule within the current scan period based on memory operation commands the memory controller received from the host. Specifically, the memory controller may remove some unnecessary scan commands from the media scan schedule within the current scan period. For example, if a memory write command transmitted from the host to the memory controller requests the memory device to write data to a memory cell, and the memory cell has not been scanned in the current scan period, then the memory controller may treat the memory cell as if the memory cell has already been refreshed. There is no need to scan the memory cell during media scan because the memory write operation will reset the set Vt and the reset Vt of the memory cell anyway. This dynamic media scan schedule adjustment may reduce the scan commands and the refresh commands transmitted to the memory device, and thus may improve the QoS of the memory device including the latency in memory read and write operations.

In another example, if a memory read command from the host to the memory controller requests the memory device to read data from a memory cell, and the memory cell has not been scanned in the current scan period, then the memory controller may not schedule and send a scan command for the memory cell. The memory controller may treat the memory read command for the regular memory operation as a scan command, and receive read result from the memory device for the memory cell. The memory controller may check the read result and determine whether or not to send a refresh command and whether or not to decrease the scan period in a way similar to those discussed above.

Figure 8:
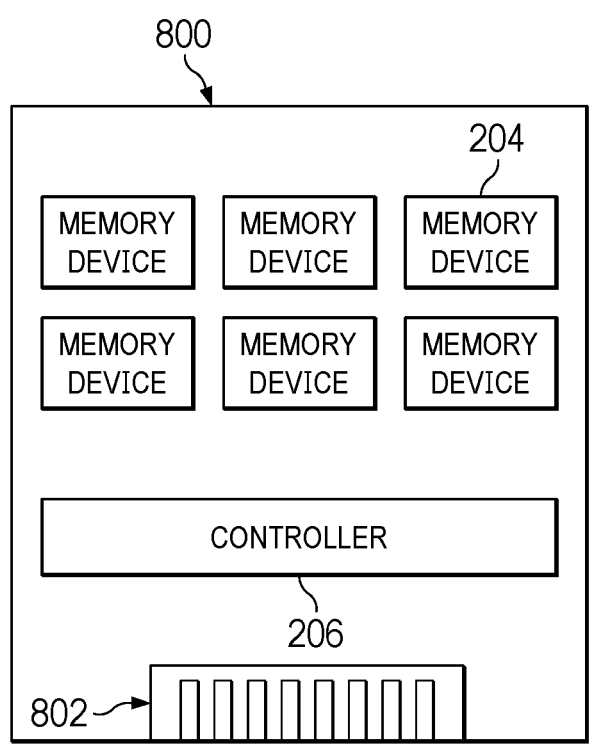
FIG. 8 illustrates a diagram of a storage device, according to some aspects of the present disclosure.

In an example as shown in FIG. 8, memory controller 206 and multiple memory devices 204 may be integrated into a storage device 800. The storage device 800 may further include an interface 802 coupling the storage device 800 with a host (e.g., host 208 in FIG. 2). In some implementations, the storage capacity and/or the operation speed of the storage device 800 is greater than those of a memory card. In some implementations, the storage device 800 is a storage class memory (SCM) device. The storage device 800 may be an SSD. The interface 802 may be an SSD connector or a Peripheral Component Interconnect Express (PCI-E) interface.

Although in this disclosure some implementations are described in the context of PCM cells to mitigate data corruption caused by Vt drift, it should be appreciated that such description is not so limited and can also be applicable to a memory device or a storage device using any other technologies known in the art that have similar technical problems. For example, some implementations in the present disclosure may be applied to a dynamic random-access memory (DRAM) device to fix a charge leaking issue or applied to a NAND Flash memory for data retention purpose.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multi-tasking or parallel processing (or a combination of multi-tasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

According to one aspect of the present disclosure, a method for a memory system is disclosed. The method includes receiving commands from a host coupled to the memory system, wherein the memory system includes a memory device, the memory device includes a memory cell array, and the memory cell array includes a number of memory cells. The method further includes performing operations on the memory device based on the commands. The method further includes scanning at least a first group of memory cells of the memory cell array by performing a number of scans within a first scan period among the operations. The foregoing and other described aspects of the present disclosure can each, optionally, include one or more of the following features.

In some implementations, the method further includes obtaining a scanning result that includes a FBC of a portion of the number of memory cells. The method further includes determining whether the FBC is larger than a refresh threshold. The method further includes in response to at least that the FBC is larger than the refresh threshold, refreshing the portion of the number of memory cells to restore voltages of stored data in the portion of the number of memory cells.

In some implementations, the method further includes decreasing the first scan period upon determining that the FBC is beyond an ECC capability.

In some implementations, the method further includes scanning a second group of memory cells of the memory cell array within a second scan period, wherein the first scan period is determined based on a first electric distance of the first group of memory cells, and the second scan period is determined based on a second electric distance of the second group of memory cells.

In some implementations, the first scan period is shorter than the second scan period based on that the first electric distance of the first group of memory cells is smaller than the second electric distance of the second group of memory cells.

In some implementations, the number of scans are time-based scans, each of the number of scans occupies a fixed scan interval, and the number of scans and the fixed scan interval are determined based on the first scan period and a size of the first group of memory cells.

In some implementations, each adjacent two of the number of scans are performed with a uniform interval within the first scan period among the operations.

In some implementations, the commands include at least one of a memory read command and a memory write command.

In some implementations, the number of memory cells are PCM cells.

In some implementations, the scanning at least a first group of memory cells of the memory cell array includes scanning all memory cells of an entirety of the memory device.

According to another aspect of the present disclosure, a memory system is disclosed. The memory system includes a memory device including a memory cell array, wherein the memory cell array includes a number of memory cells. The memory system further includes a memory controller coupled to the memory device. The memory controller is configured to perform operations including receiving host commands from a host coupled to the memory controller. The operations further include sending the host commands to the memory device. The operations further include sending a first number of scan commands to the memory device to scan a first group of memory cells of the memory device within a first scan period, wherein the first number of scan commands are distributed among the host commands. The foregoing and other described aspects of the present disclosure can each, optionally, include one or more of the following features.

In some implementations, each of the first number of scan commands is in a form of a memory read command.

In some implementations, the operations further include receiving a scanning result from the memory device, wherein the scanning result comprises an FBC of a portion of the number of memory cells, determining whether the FBC is larger than a refresh threshold, and in response to at least that the FBC is larger than the refresh threshold, sending a refresh command to the memory device to restore voltages of stored data in the portion of the number of memory cells.

In some implementations, the operations further include sending a second number of scan commands to the memory cell array to scan a second group of memory cells of the memory device within a second scan period, wherein the first scan period is determined based on a first electric distance of the first group of memory cells, the second scan period is determined based on a second electric distance of the second group of memory cells, and the first scan period is shorter than the second scan period based on that the first electric distance is smaller than the second electric distance.

In some implementations, the number of memory cells are PCM cells.

In some implementations, the memory device is an SCM device.

According to another aspect of the present disclosure, a memory system is disclosed. The memory system includes a memory device including a memory cell array, wherein the memory cell array includes a number of memory cells. The memory system further includes a memory controller coupled to the memory device. The memory controller includes at least one processor and at least one non-transitory computer readable storage medium. The at least one non-transitory computer readable storage medium stores programming instructions for execution by the at least one processor to cause the memory controller to perform operations including receiving host commands from a host coupled to the memory controller. The operations further include sending the host commands to the memory device. The operations further include sending a first number of scan commands to the memory device to scan a first group of memory cells of the memory device within a first scan period, wherein the first number of scan commands are distributed among the host commands. The foregoing and other described aspects of the present disclosure can each, optionally, include one or more of the following features.

In some implementations, each of the first number of scan commands is in a form of a memory read command.

In some implementations, the operations further include receiving a scanning result from the memory device, wherein the scanning result comprises an FBC of a portion of the number of memory cells, determining whether the FBC is larger than a refresh threshold, and in response to at least that the FBC is larger than the refresh threshold, sending a refresh command to the memory device to restore voltages of stored data in the portion of the number of memory cells.

In some implementations, the operations further include sending a second number of scan commands to the memory cell array to scan a second group of memory cells of the memory device within a second scan period, wherein the first scan period is determined based on a first electric distance of the first group of memory cells, the second scan period is determined based on a second electric distance of the second group of memory cells, and the first scan period is shorter than the second scan period based on that the first electric distance is smaller than the second electric distance.

In some implementations, the number of memory cells are PCM cells.

In some implementations, the memory device is an SCM device.

According to another aspect of the present disclosure, a non-transitory computer-readable storage medium is disclosed. The non-transitory computer-readable storage medium includes programmable instructions for execution by at least one processor of a memory system to cause the memory system to perform operations including receiving commands from a host coupled to the memory system, wherein the memory system includes a memory device, the memory device includes a memory cell array, and the memory cell array includes a number of memory cells. The operations further include performing memory operations on the memory device based on the commands. The operations further include scanning at least a first group of memory cells of the memory cell array by performing a number of scans within a first scan period among the memory operations. The foregoing and other described aspects of the present disclosure can each, optionally, include one or more of the following features.

In some implementations, the operations further include obtaining a scanning result that includes a FBC of a portion of the number of memory cells. The operations further include determining whether the FBC is larger than a refresh threshold. The operations further include in response to at least that the FBC is larger than the refresh threshold, refreshing the portion of the number of memory cells to restore voltages of stored data in the portion of the number of memory cells.

In some implementations, the operations further include scanning a second group of memory cells of the memory cell array within a second scan period, wherein the first scan period is determined based on a first electric distance of the first group of memory cells, and the second scan period is determined based on a second electric distance of the second group of memory cells.

In some implementations, the number of memory cells are PCM cells.

In some implementations, the memory device is an SCM device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described example implementations, but should be defined only in accordance with the following claims and their equivalents. Accordingly, other implementations also are within the scope of the claims.

What is claimed is:

1. A method for a memory system, comprising:
   receiving commands from a host coupled to the memory system, wherein the memory system comprises a memory device, the memory device comprises a memory cell array, and the memory cell array comprises memory cells;
   performing operations on the memory device based on the commands; and
   scanning at least a first group of memory cells of the memory cell array by performing a number of scans within a first scan period among the operations, wherein the first scan period is determined based on a first electric distance of the first group of memory cells.

2. The method according to claim 1, further comprising:
   obtaining a scanning result that comprises a fail bit count (FBC) of a portion of the memory cells;
   determining whether the FBC is larger than a refresh threshold; and
   in response to at least that the FBC is larger than the refresh threshold, refreshing the portion of the memory cells to restore voltages of stored data in the portion of the memory cells.

3. The method according to claim 2, further comprising:
   decreasing the first scan period upon determining that the FBC is beyond an error correction code (ECC) capability.

4. The method according to claim 1, further comprising:
   scanning a second group of memory cells of the memory cell array within a second scan period, wherein the second scan period is determined based on a second electric distance of the second group of memory cells.

5. The method according to claim 4, wherein the first scan period is shorter than the second scan period based on that the first electric distance of the first group of memory cells is smaller than the second electric distance of the second group of memory cells.

6. The method according to claim 1, wherein the number of scans are time-based scans, each of the number of scans occupies a fixed scan interval, and the number of scans and the fixed scan interval are determined based on the first scan period and a size of the first group of memory cells.

7. The method according to claim 1, wherein each adjacent two of the number of scans are performed with a uniform interval within the first scan period among the operations.

8. The method according to claim 1, wherein the commands comprise at least one of a memory read command and a memory write command.

9. The method according to claim 1, wherein the memory cells are phase change memory (PCM) cells.

10. The method of claim 1, wherein the first electric distance of the first group of memory cells is determined based on a first group of electric distances, and at least one electric distance of the first group of electric distances is an electric distance between a corresponding memory cell of the first group of memory cells and a driver of the corresponding memory cell.

11. A memory system, comprising:
a memory device comprising a memory cell array, wherein the memory cell array comprises memory cells, and
a memory controller coupled to the memory device, wherein the memory controller is configured to perform operations comprising:
receiving host commands from a host coupled to the memory controller;
sending the host commands to the memory device; and
sending a first number of scan commands to the memory device to scan a first group of memory cells of the memory device within a first scan period, wherein the first number of scan commands are distributed among the host commands, and the first scan period is determined based on a first electric distance of the first group of memory cells.

12. The memory system according to claim 11, wherein each of the first number of scan commands is in a form of a memory read command.

13. The memory system according to claim 11, wherein the operations further comprise:
receiving a scanning result from the memory device, wherein the scanning result comprises a fail bit count (FBC) of a portion of the memory cells;
determining whether the FBC is larger than a refresh threshold; and
in response to at least that the FBC is larger than the refresh threshold, sending a refresh command to the memory device to restore voltages of stored data in the portion of the memory cells.

14. The memory system according to claim 11, wherein the operations further comprise:
sending a second number of scan commands to the memory cell array to scan a second group of memory cells of the memory device within a second scan period, wherein the second scan period is determined based on a second electric distance of the second group of memory cells, and the first scan period is shorter than the second scan period based on that the first electric distance is smaller than the second electric distance.

15. The memory system according to claim 11, wherein the memory cells are phase change memory (PCM) cells.

16. The memory system of claim 11, wherein the first electric distance of the first group of memory cells is determined based on a first group of electric distances, and at least one electric distance of the first group of electric distances is an electric distance between a corresponding memory cell of the first group of memory cells and a driver of the corresponding memory cell.

17. A non-transitory computer-readable storage medium, comprising programmable instructions for execution by at least one processor of a memory system to cause the memory system to perform operations comprising:
receiving commands from a host coupled to the memory system, wherein the memory system comprises a memory device, the memory device comprises a memory cell array, and the memory cell array comprises memory cells;
performing memory operations on the memory device based on the commands; and
scanning at least a first group of memory cells of the memory cell array by performing a number of scans within a first scan period among the memory operations, wherein the first scan period is determined based on a first electric distance of the first group of memory cells.

18. The non-transitory computer-readable storage medium according to claim 17, wherein the operations further comprise:
obtaining a scanning result that comprises a fail bit count (FBC) of a portion of the memory cells;
determining whether the FBC is larger than a refresh threshold; and
in response to at least that the FBC is larger than the refresh threshold, refreshing the portion of the memory cells to restore voltages of stored data in the portion of the memory cells.

19. The non-transitory computer-readable storage medium according to claim 17, wherein the operations further comprise:
scanning a second group of memory cells of the memory cell array within a second scan period, wherein the second scan period is determined based on a second electric distance of the second group of memory cells.

20. The non-transitory computer-readable storage medium of claim 17, wherein the first electric distance of the first group of memory cells is determined based on a first group of electric distances, and at least one electric distance of the first group of electric distances is an electric distance between a corresponding memory cell of the first group of memory cells and a driver of the corresponding memory cell.

* * * * *